United States Patent [19]
Pacansky et al.
[11] 4,218,514
[45] * Aug. 19, 1980

[54] PROCESS FOR PREPARING WATERLESS PRINTING MASTERS

[75] Inventors: Thomas J. Pacansky; Alan B. Amidon, both of Penfield, N.Y.

[73] Assignee: Xerox Corporation, Stamford, Conn.

[ * ] Notice: The portion of the term of this patent subsequent to Mar. 7, 1995, has been disclaimed.

[21] Appl. No.: 776,150

[22] Filed: Mar. 10, 1977

[51] Int. Cl.[2] .......... B41N 1/06; G03F 7/02
[52] U.S. Cl. .......... 428/447; 101/457; 428/450; 525/106; 430/302
[58] Field of Search .......... 260/827, 824 R; 428/195, 199, 447, 450, 451, 452, 909, 914; 96/133; 101/137, 426, 457

[56] References Cited

U.S. PATENT DOCUMENTS

| | | | |
|---|---|---|---|
| 3,576,904 | 4/1971 | Saam et al. | 260/827 X |
| 3,665,052 | 5/1972 | Saam et al. | 260/827 X |
| 3,678,126 | 7/1972 | Saam et al. | 260/827 |
| 3,686,356 | 8/1972 | Saam | 260/827 X |
| 3,857,720 | 12/1974 | Fellows | 428/447 X |
| 4,009,032 | 2/1977 | Shank | 96/33 |
| 4,020,761 | 5/1977 | Ogiwara et al. | 428/447 X |
| 4,077,325 | 3/1978 | Pacansky et al. | 96/33 X |
| 4,078,927 | 3/1978 | Amidon et al. | 96/33 X |

OTHER PUBLICATIONS

Saam et al, *Block Copolymers of Polydimethylsiloxane and Polystyrene,* in Macromolecules, vol. 3, No. 1, Feb. 1970, p. 1.

*Primary Examiner*—George F. Lesmes
*Assistant Examiner*—R. Eugene Varndell, Jr.
*Attorney, Agent, or Firm*—James F. Tao

[57] ABSTRACT

Improved waterless lithographic printing masters are provided having minimum background ink reflection density. The master comprises a crosslinked block copolymer containing elastomeric, ink releasing siloxane blocks chemically linked to organic image accepting thermoplastic blocks, said copolymer having a molecular weight for the organic blocks sufficient to provide strength and a background ink reflection density of less than 0.02 and preferably less than 0.01.

2 Claims, No Drawings

PROCESS FOR PREPARING WATERLESS PRINTING MASTERS

BACKGROUND OF THE INVENTION

This invention relates to a novel waterless lithographic master of the planographic type and to a method for preparing said master.

In conventional lithography, an aqueous fountain solution is employed to prevent the ink from wetting the nonimaged areas of the planographic plate. It has recently been discovered that the requirement for a fountain solution can be obviated by employing a planographic plate having a silicone, i.e., organopolysiloxane, elastomeric layer. Because the silicone is not wetted by the printing ink, no fountain solution is required. While the use of silicone elastomers as a printing surface has obviated the requirement for a fountain solution, it has been found that finely divided particulate material commonly referred to in the trade as "toner", is not easily attached to the silicone. Thus, the abhesive or nonadhesive property of the silicone which renders it useful for rejecting lithographic inks, also causes it to reject other materials such as toner. Accordingly, it has been difficult to prepare a printing master in which the toner could be sufficiently attached to the silicone such that it would not become removed after a short run on a printing press.

In order to adhere a particulate imaging material to the abhesive silicone, it has been discovered that a copolymer can be employed comprising a major portion of siloxane blocks and a minor portion of organic thermoplastic blocks. This permits the master to be imaged with a particulate image material and the thermoplastic blocks softened and then hardened to bond the particulate imaging material thereto. Thus, the thermoplastic blocks permit the imaging material to be physically bonded thereto and the siloxane blocks provide an insoluble ink releasing background area so that no dampening or fountain solution is required. A difficulty encountered with the block copolymers, however, is that the background areas tend to ink slightly so as to impair the contrast. It is this problem to which this invention is directed.

BRIEF DESCRIPTION OF THE INVENTION

It has now been discovered that a master comprising a conventional self-supporting master substrate and an overlying layer of a crosslinked block copolymer having ink releasing elastomeric siloxane blocks and image accepting organic thermoplastic blocks can be formed with a sufficient composition and number average molecular weight ($M_n$) for each segment to provide substantially no background inking. Surprisingly it has been discovered that an increase of $M_n$ for the image accepting thermoplastic blocks from 3000 to about 6500 or more results in a three-fold decrease in background ink reflection density.

DETAILED DESCRIPTION OF THE INVENTION

Typical materials which include the types of master materials as well as detailed instructions for preparing the masters are herein discussed in detail.

Substrates which can be employed for the printing master are those self-supporting materials to which the copolymer can adhere and be compatible therewith as well as possess sufficient heat and mechanical stability to permit use under widely varying conditions. Exemplary of suitable substrates are paper; metals such as aluminum; plastics such as polyesters, polycarbonates, polysulfones, nylons and polyurethanes.

When a substrate which is nonphotoconductive is employed, the substrate can be coated with a photoconductive material by conventional means such as draw bar coating, vacuum evaporation and the like. A thickness of between 0.02 and 20 microns is conventional. Typical inorganic crystalline photoconductors include cadmium sulfide, cadmium sulfoselenide, cadmium selenide, zinc sulfide, zinc oxide and mixtures thereof. Typical inorganic photoconductive materials include amorphous selenium, and selenium alloys such as selenium-tellurium, and selenium-arsenic. Selenium may also be used in its hexagonal crystalline form, commonly referred to as trigonal selenium. Typical organic photoconductors include phthalocyanine pigments such as the X-form of metal free phthalocyanine described in U.S. Pat. No. 3,357,989 to Byrne et al, and metal phthalocyanine pigments, such as copper phthalocyanine. Other typical organic photoconductors include poly(vinyl carbazole), trinitrofluorenone and photo-injecting pigments such as benzimidazole pigments, parylene pigments, quinacridone pigments, indigoid pigments and polynuclear quinones. Alternatively, the photoconductor can be dispersed in a binder of one of the aforesaid polymeric substrate materials to serve as the ink accepting substrate.

The surface copolymer layer is formed of ink releasable, elastomeric polysiloxane groups and organic thermoplastic blocks which provide physical strength and can be alternately softened and hardened so as to bond the particulate imaging material thereto. The siloxane blocks can be those having only alkyl containing groups in the polymer chain such as polydimethylsiloxane or polydiethylsiloxane; gums having both alkyl and phenyl containing groups in the polymer chain as well as gums having both alkyl and vinyl groups, alkyl and fluorine groups or alkyl, phenyl and vinyl groups in the polymer chain. The organic materials employed to form the hydrocarbon backbone thermoplastic blocks in the copolymer are conventional thermoplastic monomers such as styrene, α-methylstyrene, styrene/n-butyl methacrylate, and styrene-butadiene. The thermoplastic blocks may also contain condensation polymers such as polyester, polyamide or polycarbonate materials. Examples of these are epichlorohydrin-bisphenol-A polymers, poly(hexamethylene sebacate) and Nylon 66.

While not limiting, preferred proportions for the copolymer comprise a ratio by weight of between about 50–99 parts polysiloxane to 1 to 50 parts of the thermoplastic blocks. A most preferred ratio is from about 80–90 parts polysiloxane groups to provide optimum ink releasing properties and image adhesion properties.

Catalysts which will preferentially cure the siloxane blocks may also be employed to improve the physical strength of the coatings. Typical catalysts include the peroxides such as benzoyl peroxide and the like, the particular catalyst depending upon the silicone employed. Suitable catalysts are provided by the manufacturers of the silicone gums.

Copolymers of the above type can be prepared in the manner illustrated by the procedure for preparation of an organo-polysiloxane polystyrene block copolymer as described in Macromolecules, Volumn 3, January-February 1970, pages 1–4, which is herein incorporated by reference to its entirety. Suitable molecular weights to provide low background ink reflection density will vary depending upon the particular blocks employed in the copolymer. Generally, the thermoplastic blocks (hard segment) will have a number average molecular weight of more than about 6000. The only practical upper limit is the difficulty of preparing the block copolymers with hard segment molecular weights of 20,000 or more and optimum results can generally be achieved with segment average number molecular weights of from 6000 to 11,000 for the thermoplastic blocks.

The copolymer can be coated on the substrate by conventional means such as draw bar coating, preferably with a catalyst in a suitable solvent and the solvent allowed to evaporate. To improve the physical strength properties and decrease abrasion and wear, the siloxane blocks are then crosslinked, such as by heat, to activate the catalyst. The amount of crosslinking will depend upon the materials employed, temperature and time but can be measured by its swelling in a suitable solvent. Generally the polymers will swell between about 20% and 300% in dodecane, tetrahydrofuran, xylene, toluene and other solvents listed in *Polymer Handbook*, J. Brandup and E. H. Immergut, pages IV 185–IV 234, Interscience Publishing, N.Y. 1966. The siloxane blocks should be cured sufficiently such that the copolymer remains ink releasing but not so much that the thermoplastic blocks become cured so that the particulate imaging material cannot be physically bonded thereto. Crosslinking agents made from silicone materials are preferred.

After the siloxane blocks are cured, the master can be imaged by conventional means such as electrostatographic imaging, either directly on the master and developed thereon, or formed and developed on a separate photoconductive surface and transferred to the master surface. The particulate imaging material can be any conventional ink accepting material commonly referred to in the art as toner. Typical toners include thermoplastic polymers such as polyethylene, polyesters and polymers of styrene. Typical polymers of styrene include polystyrene, styrene/n-butyl methacrylate copolymer and styrene-butadiene copolymer. Other materials which can be employed include: polypropylene, poly(α-methylstyrene), ethylene-vinyl acetate copolymers, polyamides, polyimides, phenoxies, polyesters and vinyls. Although it is preferred, the imaging material need not be thermoplastic. Typical nonthermoplastic materials are carbon black, and inorganic salts, which can also be employed. After the master is imaged, the particulate material can be fixed by heating the master to soften the thermoplastic blocks and then cooling or allowing the blocks to cool so as to harden and bond the particulate imaging material thereto. Alternatively the copolymer can be removed in image configuration to permit printing from the underlying ink accepting substrate.

The imaged printing master can then be employed on conventional planographic printing equipment by direct or offset means with the dampening system removed to provide good quality prints over an extended period of operation with conventional inks of the oleophilic, glycol or rubber based type. If desired, the master can be reimaged by removing the particulate imaging material with a suitable solvent and the thermoplastic blocks softened to accept a new imaging material.

The following examples will serve to illustrate the invention and embodiments thereof. All parts and percentages in said examples and elsewhere in the specification and claims are by weight unless otherwise specified.

EXAMPLE I

A printing master is prepared by draw bar coating a thin layer (0.0005") of Chemlok 607 adhesive (~10% solids, Hughson Chemical Co.) on a grained aluminum lithographic master (10"×15"×0.006") and air drying for 30 minutes at room temperature, overcoating with a solution consisting of 25.0 grams of a 10 weight percent solution of a film forming polymer of 90/10 polydimethylsiloxane/poly(α-methylstyrene) (90/10 PDMS/PAMS) multiblock copolymer (PAMS $M_n$ 3000) in xylene blended with 0.05 gram of a 50 percent by weight paste of benzoyl peroxide in silicone oil and air drying to a film thickness of about 6–8 microns. The plate is covered to exclude air and then placed on a hot metal shelf for several minutes at 170°–175° C. in an oven to initiate the crosslinking reaction of the siloxane. The plate is then allowed to cool to room temperature. The plate is imaged employing a Xerox Model D processor, the image developed on a selenium flat plate with a toner comprising a thermoplastic poly(α-methylstyrene) and the developed image is electrostatically transferred to the surface of the cured block copolymer. The toner image is cofused with the heat sensitive organic poly(αmethylstyrene) blocks by placing the plate on a hot metal shelf at 225° C. in an air oven for 1 minute and then the plate allowed to cool to room temperature. The plate is then employed on a Davidson Dual-a-matic printing press operating in the direct mode with Ronico rubber base ink XL91779, and no fountain solution, and 1000 prints generated. Representative prints had a background ink reflection density ($D_{min}$) of 0.03 employing a Welch Densichron-1 Magnephot System, Model 451-4 equipped with a 3832a reflection unit. A 3/16" aperture setting was employed and the values corrected to eliminate the reflection density of the paper receiver sheet.

EXAMPLE II

The procedure of Example I is repeated but for the exception that the copolymer has a number average molecular weight of 6500 for the α-methylstyrene blocks and the background ink reflection density was found to be 0.01 for a three-fold improvement over the copolymer of Example I.

EXAMPLES III–IV

The procedure of Examples I and II are repeated for making block copolymer printing plates but for the exception that crosslinking agents are not used. Satisfactory $D_{min}$ printing results are obtained. The run lengths, however, were lower than in Examples I and II as shown in Table I.

TABLE I

| Example | 90/10 PDMS/PAMS $M_n$ for PAMS | Number of Prints to Failure[1] | Crosslinked |
|---|---|---|---|
| I | 3000 | >>1000 | Yes |
| II | 6500 | >>1000 | Yes |
| III | 3000 | 200–400 | No |
| IV | 6500 | 500–700 | No |

[1]Failure is defined as the number of prints to raise $D_{min}$ to 0.03.

EXAMPLES V–VI

The procedure of Example II is repeated for making block copolymer printing plates but for the exception that the 90/10 PDMS/PAMS block copolymer materials have $M_n$ of 11,000 and 22,000 respectively for the poly($\alpha$-methylstyrene) segments. Similar results are found to those in Example II.

EXAMPLES VII–VIII

The procedure of Example II and Example III are repeated but for the exception that the multiblock copolymer employed is a copolymer of dimethylsiloxane and styrene blocks in a weight ratio of 80:20 with a number average molecular weight of 11,000 for the styrene blocks. Similar results to those of Example II are achieved.

EXAMPLE IX

Test specimens were fabricated by heat laminating a 40 mil polyester substrate material containing a 15$\mu$ block copolymer coating to a piece of 6.0 mil thick grained aluminum with a 7.5$\mu$ coating of an image material. Peel strength measurements were performed on 1 inch wide test specimens at 180° pull angle using an Instron force measurement device at a crosshead speed of 12 inch/minute and a chart speed of 2 inch/minute. The peel strength data in Table II show that adequate image material (toner) adhesion was obtained over a wide range of block copolymer materials.

TABLE II

| Polymer Background Material | $\overline{M}_n$ for AMS Segments | Image Material | Peel Strength (g/cm) |
|---|---|---|---|
| 90/10 PDMS/PAMS | 3,000 | P(AMS) | 790 |
| 90/10 PDMS/PAMS | 6,500 | P(AMS) | 450 |
| 90/10 PDMS/PAMS | 11,000 | P(AMS) | 460 |
| 90/10 PDMS/PAMS | 22,000 | P(AMS) | 300 |
| PDMS | — | P(AMS) | <2 |

Having described the present invention with reference to these specific embodiments, it is to be understood that numerous variations can be made without departing from the spirit of the invention and it is intended to include such reasonable variations and equivalents within the scope.

What is claimed is:

1. A printing master having image areas of ink receptivity and nonimage areas of ink releasability comprising a self-supporting master substrate and an overlying layer of a film forming crosslinked block copolymer of from 80 to 90 weight percent elastomeric siloxane blocks and 10 to 20 weight percent of image accepting polymeric styrene blocks, said image accepting polymeric styrene blocks having a molecular weight of between 6,000 and 11,000.

2. A printing master of claim 1 wherein the copolymer comprises poly ($\alpha$methylstyrene) and polydimethylsiloxane blocks.

* * * * *